(12) United States Patent
Mizuguchi

(10) Patent No.: US 11,595,025 B2
(45) Date of Patent: Feb. 28, 2023

(54) VIBRATOR DEVICE

(71) Applicant: SEIKO EPSON CORPORATION, Tokyo (JP)

(72) Inventor: Akira Mizuguchi, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 52 days.

(21) Appl. No.: 17/201,537

(22) Filed: Mar. 15, 2021

(65) Prior Publication Data

US 2021/0297062 A1 Sep. 23, 2021

(30) Foreign Application Priority Data

Mar. 17, 2020 (JP) .............................. JP2020-046074

(51) Int. Cl.
*H03H 9/19* (2006.01)
*H03H 9/05* (2006.01)
*H03B 5/32* (2006.01)
*H03H 9/10* (2006.01)
*H03H 9/02* (2006.01)
*H03H 9/09* (2006.01)
*H03H 3/02* (2006.01)
*H03L 7/099* (2006.01)

(52) U.S. Cl.
CPC ................ *H03H 9/19* (2013.01); *H03B 5/32* (2013.01); *H03H 3/02* (2013.01); *H03H 9/02102* (2013.01); *H03H 9/0542* (2013.01); *H03H 9/0547* (2013.01); *H03H 9/09* (2013.01); *H03H 9/1021* (2013.01); *H03L 7/099* (2013.01)

(58) Field of Classification Search
CPC ...... H03H 9/19; H03H 9/0542; H03H 9/1021; H03H 9/02102; H03H 9/0547; H03H 3/02; H03H 9/09; H03B 5/32; H03L 7/08
USPC ................................ 331/158, 116 FE, 108 C
See application file for complete search history.

(56) References Cited

U.S. PATENT DOCUMENTS

2010/0289589 A1* 11/2010 Ito ........................... H03L 1/022
331/70
2012/0319792 A1* 12/2012 Harima ................ H03H 9/1021
331/158

FOREIGN PATENT DOCUMENTS

JP         2004-214787         7/2004

* cited by examiner

*Primary Examiner* — Arnold M Kinkead
(74) *Attorney, Agent, or Firm* — Rankin, Hill & Clark LLP

(57) ABSTRACT

A vibrator device includes a semiconductor substrate, a vibrator element, a circuit element, a wiring, a processing circuit, and a through electrode. The semiconductor substrate has a first surface and an opposite-side second surface of the semiconductor substrate from the first surface. The vibrator element is provided at the first surface. The circuit element is provided at the first surface and includes an oscillation circuit. The wiring is provided at the first surface and electrically couples the vibrator element and the oscillation circuit. The processing circuit is provided at the second surface and processes an output signal of the oscillation circuit. The through electrode penetrates the semiconductor substrate and electrically couples the oscillation circuit and the processing circuit.

8 Claims, 5 Drawing Sheets

VIBRATOR DEVICE

The present application is based on, and claims priority from JP Application Serial Number 2020-046074, filed Mar. 17, 2020, the disclosure of which is hereby incorporated by reference herein in its entirety.

BACKGROUND

1. Technical Field

The present disclosure relates to a vibrator device.

2. Related Art

A piezoelectric oscillator disclosed in JP-A-2004-214787 includes an integrated circuit substrate including an oscillation circuit formed at one side of a flat plate made of an electrically insulating material and a cavity formed at the other side, a vibrator element fixed to a bottom of the cavity, a through electrode that penetrates the flat plate and that electrically couples the oscillation circuit and the vibrator element, and a lid bonded to an upper surface of the flat plate in a manner of covering an opening of the cavity. In this way, it is possible to reduce the size of the piezoelectric oscillator by mounting the vibrator element on the integrated circuit substrate.

However, in the piezoelectric oscillator in JP-A-2004-214787, the oscillation circuit and the vibrator element are electrically coupled via the through electrode. In this way, in the configuration in which the oscillation circuit and the vibrator element are electrically coupled via the through electrode, parasitic capacitance contained in the through electrode becomes large, and thus oscillation characteristics may be deteriorated.

SUMMARY

A vibrator device according to an application example includes: a semiconductor substrate having a first surface and an opposite-side second surface of the semiconductor substrate from the first surface; a vibrator element provided at the first surface; a circuit element that is provided at the first surface and that includes an oscillation circuit; a wiring that is provided at the first surface and that electrically couples the vibrator element and the oscillation circuit; a processing circuit that is provided at the second surface and that processes an output signal of the oscillation circuit; and a through electrode that penetrates the semiconductor substrate and that electrically couples the oscillation circuit and the processing circuit.

A vibrator device according to another application example includes: a first semiconductor substrate having a first surface and an opposite-side second surface of the first semiconductor substrate from the first surface; a circuit element including a second semiconductor substrate that is provided at the first surface and that has an opposite-side third surface of the second semiconductor substrate from the first surface, and an oscillation circuit provided at the third surface; a vibrator element provided at the third surface of the circuit element; a wiring that is provided at the third surface and that electrically couples the vibrator element and the oscillation circuit; a processing circuit that is provided at the second surface and that processes an output signal of the oscillation circuit; and a first through electrode that penetrates the first semiconductor substrate and that electrically couples the oscillation circuit and the processing circuit.

DESCRIPTION OF EXEMPLARY EMBODIMENTS

Hereinafter, a vibrator device, an electronic apparatus, and a vehicle according to an aspect of the present disclosure will be described in detail based on embodiments shown in the accompanying drawings.

First Embodiment

Figure 1:
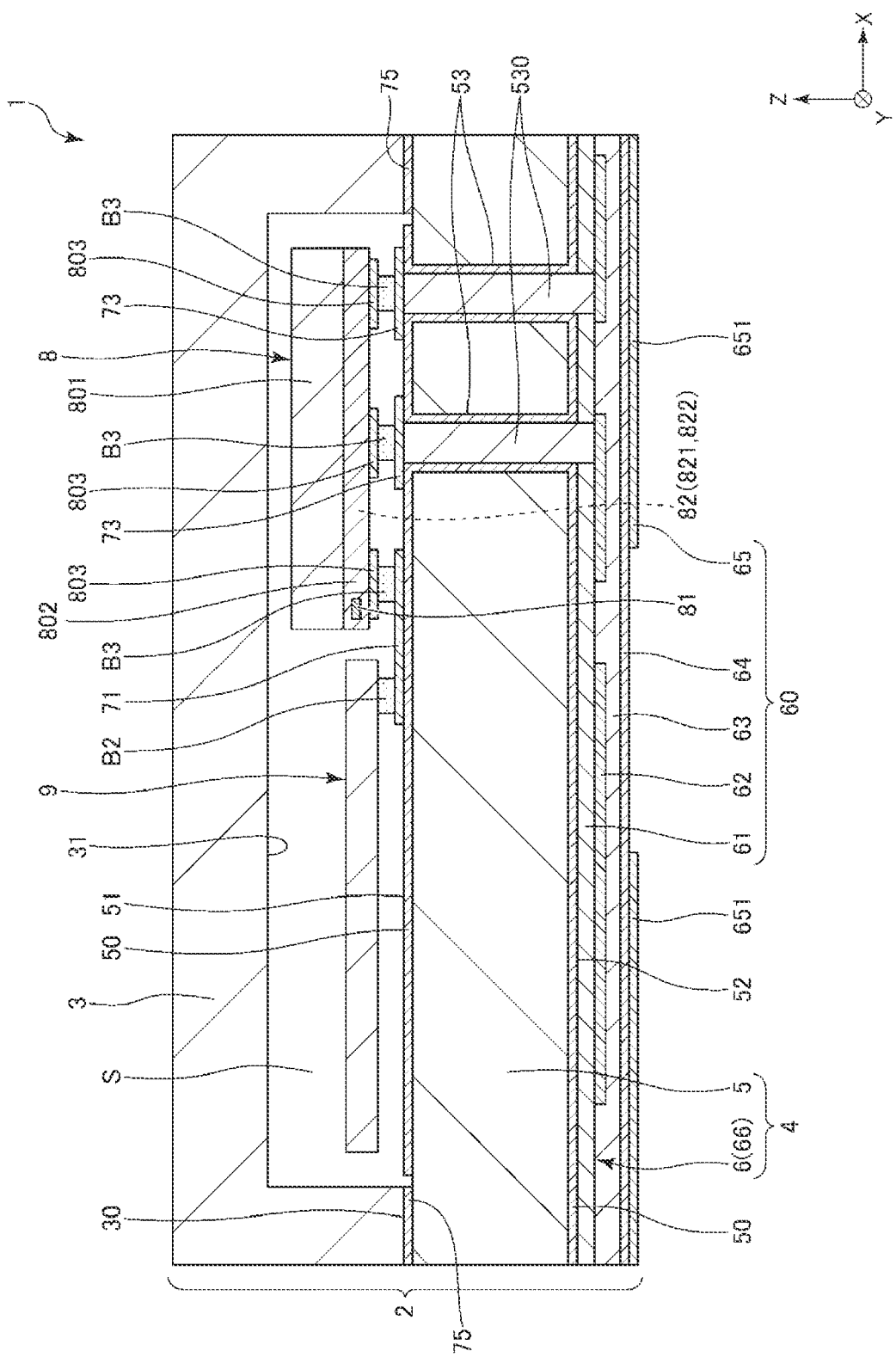
FIG. 1 is a cross-sectional view showing a vibrator device according to a first embodiment.
Figure 2:
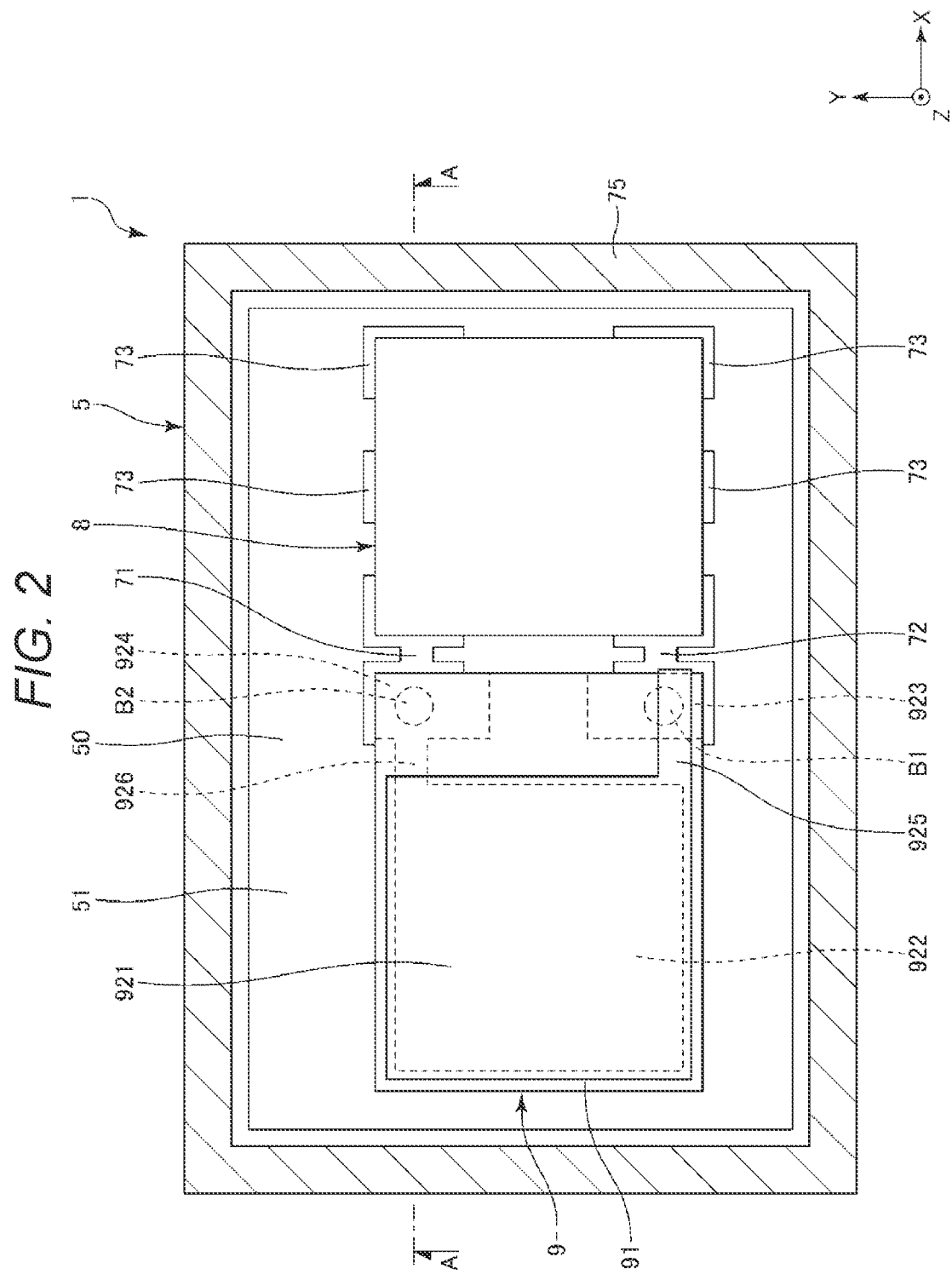
FIG. 2 is a plan view showing a vibrator element and a circuit element that are provided in the vibrator device shown in FIG. 1.
Figure 3:
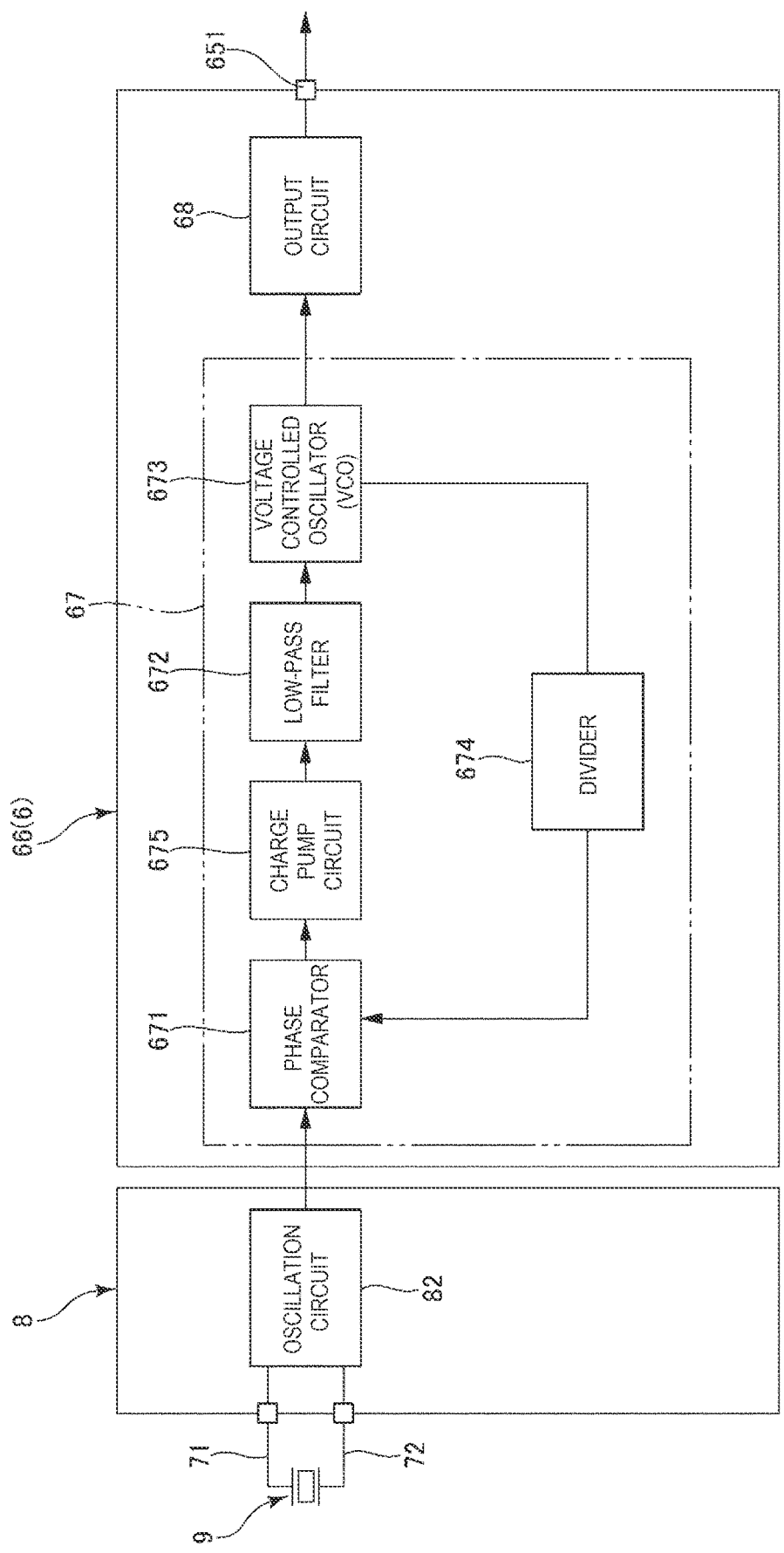
FIG. 3 is a block diagram showing a circuit configuration of the vibrator device in FIG. 1.

FIG. 1 is a cross-sectional view showing a vibrator device according to a first embodiment. FIG. 2 is a plan view showing a vibrator element and a circuit element that are provided in the vibrator device shown in FIG. 1. FIG. 3 is a block diagram showing a circuit configuration of the vibrator device in FIG. 1. FIG. 1 is a cross-sectional view taken along a line A-A in FIG. 2. For convenience of explanation, FIGS. 1 and 2 show three axes orthogonal to one another as an X axis, a Y axis, and a Z axis. A tip end side of an arrow of the Z axis is also referred to as "upper", and a base end side of the arrow of the Z axis is also referred to as "lower". A tip end side of the arrow of each axis is referred to as a "positive side", and a base end side of the arrow of each axis is referred to as a "negative side". A plan view along a thickness direction of a semiconductor substrate 5, that is, the Z axis, is also simply referred to as a "plan view".

A vibrator device 1 shown in FIG. 1 is used, for example, as an oscillator. However, the vibrator device 1 may be used as a device other than the oscillator, for example, various sensors such as an acceleration sensor and an angular velocity sensor. The vibrator device 1 according to the present embodiment is a temperature compensated quartz crystal oscillator (TCXO). As shown in FIG. 1, the vibrator device 1 includes a package 2 having an accommodation space S therein, a vibrator element 9 and a circuit element 8 that are accommodated in the accommodation space S. The package 2 includes a semiconductor circuit substrate 4 and a lid 3 bonded to an upper surface of the semiconductor circuit substrate 4.

Semiconductor Circuit Substrate 4

As shown in FIG. 1, the semiconductor circuit substrate 4 includes the semiconductor substrate 5 and a circuit 6 provided on the semiconductor substrate 5. The semiconductor substrate 5 is a silicon substrate. In particular, in the present embodiment, the semiconductor substrate 5 is a P-type silicon substrate having P-type conductivity. A substrate potential is ground. The semiconductor substrate 5 may be a semiconductor substrate other than the silicon substrate, for example, various semiconductor substrates made of germanium, gallium arsenide, gallium arsenide phosphorus, gallium nitride, and silicon carbide. The semiconductor substrate 5 may be an N-type silicon substrate having N-type conductivity.

The semiconductor substrate 5 has a plate shape having an upper surface 51 as a first surface and an opposite-side lower surface 52 of the semiconductor substrate 5 from the upper surface 51 as a second surface. An insulating film 50 is formed on a surface of the semiconductor substrate 5. The insulating film 50 is made of silicon oxide ($SiO_2$), and is formed by, for example, thermally oxidizing the surface of the semiconductor substrate 5. The circuit 6 electrically coupled to the vibrator element 9 is provided on the lower surface 52 of the semiconductor substrate 5. By providing the circuit 6 on the semiconductor substrate 5, a space of the semiconductor substrate 5 can be effectively utilized.

In the following description, "provided at the upper surface 51" means that it is provided at the upper surface 51 side, and is a concept including not only the case where it is directly provided on the upper surface 51 but also the case where it is provided at a position away from the upper surface 51. This also applies to the lower surface 52.

A stacked body 60 in which an insulating layer 61, a wiring layer 62, an insulating layer 63, a passivation film 64, and a terminal layer 65 are stacked is provided at the lower surface 52 of the semiconductor substrate 5. Further, a plurality of active elements that are not shown and that are semiconductor elements formed at the lower surface 52 are electrically coupled to one another via wirings provided in the wiring layer 62 to form the circuit 6. That is, the circuit 6 is integrally formed with the semiconductor substrate 5. A plurality of terminals 651 are formed in the terminal layer 65. The plurality of terminals 651 include, for example, a terminal coupled to a power supply, a terminal coupled to the ground, and a terminal to which a signal is output from the circuit 6. The insulating layers 61 and 63 are formed of silicon oxide ($SiO_2$). The wiring layer 62 and the terminal layer 65 are formed of a conductive material such as aluminum (Al), copper (Cu), conductive polysilicon, and tungsten (W). The passivation film 64 is formed of a resin material such as polyamide. However, a constituent material of each part is not particularly limited.

In the illustrated configuration, one wiring layer 62 is provided in the stacked body 60. However, the present disclosure is not limited thereto, and a plurality of wiring layers 62 may be stacked via the insulating layer 63. That is, the wiring layer 62 and the insulating layer 63 may be alternately stacked a plurality of times between the insulating layer 61 and the passivation film 64.

As shown in FIG. 1, a plurality of through holes 53 penetrating the semiconductor substrate 5 in a thickness direction are formed in the semiconductor substrate 5. The through holes 53 are filled with a conductive material to form through electrodes 530. As shown in FIGS. 1 and 2, a pair of wirings 71 and 72 electrically coupling the vibrator element 9 and the circuit element 8 and a plurality of wirings 73 electrically coupling the circuit element 8 and the through electrodes 530 are provided at the upper surface 51 of the semiconductor substrate 5. Accordingly, the vibrator element 9, the circuit element 8, and the circuit 6 are electrically coupled to one another by the wirings 71, 72, and 73 and the through electrodes 530.

As shown in FIGS. 1 and 2, a bonding layer 75 used for bonding with the lid 3 is provided at the upper surface 51 of the semiconductor substrate 5. The bonding layer 75 is provided along an outer edge of the semiconductor substrate 5. A portion of the insulating film 50 overlapping with the bonding layer 75 is removed from the upper surface 51. However, the present disclosure is not limited thereto. The insulating film 50 may not be removed from the upper surface 51. That is, the bonding layer 75 may be provided on the insulating film 50.

Vibrator Element 9

As shown in FIG. 2, the vibrator element 9 includes a vibrator substrate 91 and electrodes arranged at a surface of the vibrator substrate 91. The vibrator substrate 91 has a thickness-shear vibration mode, and is formed of an AT cut quartz crystal substrate in the present embodiment. Since the AT cut quartz crystal substrate has third-order frequency-temperature characteristics, the AT cut quartz crystal substrate forms the vibrator element 9 having excellent temperature characteristics. The electrodes include an excitation electrode 921 provided at the upper surface of the vibrator substrate 91, an excitation electrode 922 that faces the excitation electrode 921 and that is provided at a lower surface of the vibrator substrate 91, a pair of terminals 923 and 924 provided at the lower surface of the vibrator substrate 91, a wiring 925 electrically coupling the terminal 923 and the excitation electrode 921, and a wiring 926 electrically coupling the terminal 924 and the excitation electrode 922.

The configuration of the vibrator element 9 is not limited to the above configuration. For example, the vibrator element 9 may be a mesa-type in which a vibration region sandwiched between the excitation electrodes 921 and 922 protrudes from a periphery of the vibration region. Conversely, the vibrator element 9 may be a reverse mesa-type in which the vibration region is recessed from the periphery thereof. Bevel processing for grinding the periphery of the vibrator substrate 91 or convex processing for making the upper surface and the lower surface convex curved surfaces may be performed.

The vibrator element 9 is not limited to the one that vibrates in the thickness-shear vibration mode. For example, the vibrator element 9 may be a vibrator element in which a plurality of vibrating arms flex and vibrate in an in-plane direction. That is, the vibrator substrate 91 is not limited to one formed of the AT cut quartz crystal substrate, and may be formed of a quartz crystal substrate other than the AT cut quartz crystal substrate, such as an X cut quartz crystal substrate, a Y cut quartz crystal substrate, a Z cut quartz crystal substrate, a BT cut quartz crystal substrate, an SC cut quartz crystal substrate, and an ST cut quartz crystal substrate. In the present embodiment, the vibrator substrate 91 is formed of the quartz crystal, but is not limited thereto. For example, the vibrator substrate 91 may be formed of a piezoelectric single crystal such as lithium niobate, lithium tantalate, lithium tetraborate, langasite, potassium niobate, and gallium phosphate, and may be formed of a piezoelectric single crystal other than lithium niobate, lithium tantalate, lithium tetraborate, langasite, potassium niobate, and gallium phosphate. Furthermore, the vibrator element 9 is not limited to a piezoelectric-driven type vibrator element, and may be an electrostatic-driven type vibrator element using an electrostatic force.

The vibrator element 9 is fixed to the pair of wirings 71 and 72 by conductive bonding members B1 and B2. The bonding member B1 electrically couples the wiring 71 and the terminal 923. The bonding member B2 electrically couples the wiring 72 and the terminal 924. Accordingly, the vibrator element 9 and the circuit element 8 are electrically coupled.

The bonding members B1 and B2 are not particularly limited as long as the bonding members B1 and B2 have both conductivity and bondability. For example, various metal bumps such as gold bumps, silver bumps, copper bumps, solder bumps, and conductive adhesives or the like in which a conductive filler such as a silver filler is dispersed in various polyimide-based, epoxy-based, silicone-based, and acrylic-based adhesives can be used. When the former metal bumps are used as the bonding members B1 and B2, generation of gas from the bonding members B1 and B2 can be prevented, environmental change in the accommodation space S, particularly an increase in pressure can be effectively prevented. On the other hand, when the latter conductive adhesives are used as the bonding members B1 and B2, the bonding members B1 and B2 are softer than those in the case of the metal bumps, and stress is less likely to be transmitted from the package 2 to the vibrator element 9.

Circuit Element 8

As shown in FIGS. 1 and 2, the circuit element 8 is separately formed from the semiconductor circuit substrate 4, and is provided at the upper surface 51 of the semiconductor substrate 5. The circuit element 8 includes a semiconductor substrate 801 and a circuit portion 802 formed at a lower surface side of the semiconductor substrate 801. A structure of the circuit portion 802 is the same as that of the circuit 6 described above. A plurality of active elements that are not shown are formed at the lower surface of the semiconductor substrate 801, and are electrically coupled to one another via wirings that are not shown and that are stacked at the lower surface. A plurality of terminals 803 for electrically coupling the circuit portion 802 and the outside are provided at a lower surface of the circuit portion 802.

Further, the circuit element 8 is fixed to the upper surface 51 of the semiconductor substrate 5 via a plurality of conductive bonding members B3. By the bonding members B3, the terminal 803 and the wiring 71 are electrically coupled, the terminal 803 and the wiring 72 are electrically coupled, and the terminal 803 and the wiring 73 are electrically coupled. Accordingly, the vibrator element 9, the circuit element 8, and the circuit 6 are electrically coupled to one another. The bonding member B3 is not particularly limited as long as the bonding member B3 has both conductivity and bondability. For example, the same bonding members as the above-described bonding members B1 and B2 can be used.

The circuit portion 802 of the circuit element 8 is provided with a temperature sensor 81, which is a temperature detection element, and an oscillation circuit 82. The oscillation circuit 82 has a function of oscillating the vibrator element 9 and generating a temperature compensated oscillation signal based on a temperature detected by the temperature sensor 81. That is, the oscillation circuit 82 includes an oscillation circuit portion 821 that is electrically coupled to the vibrator element 9, that amplifies an output signal of the vibrator element 9, and that feeds back the amplified signal to the vibrator element 9 to oscillate the vibrator element 9, and a temperature compensation circuit portion 822 that compensates the temperature based on temperature information output from the temperature sensor 81 so that frequency fluctuation of the output signal is smaller than frequency-temperature characteristics of the vibrator element 9 itself. Temperature characteristics of the oscillation circuit 82 are improved by providing the temperature compensation circuit portion 822 in this way.

However, the temperature sensor 81 and the temperature compensation circuit portion 822 may be omitted. That is, the vibrator device 1 may not be the temperature compensated quartz crystal oscillator. In addition to the temperature compensation circuit portion 822, a band gap reference circuit, a power supply regulator circuit, and the like may be incorporated in the circuit element 8. Accordingly, since the number of active elements required at the circuit 6 side is reduced, manufacturing cost can be reduced.

An oscillation circuit such as a Pierce oscillation circuit, an inverter-type oscillation circuit, a Colpitts oscillation circuit, or a Hartley oscillation circuit can be used as the oscillation circuit 82. The temperature compensation circuit portion 822 provided in the oscillation circuit 82 may, for example, adjust an oscillation frequency of the oscillation circuit portion 821 by adjusting capacitance of a variable capacitance circuit coupled to the oscillation circuit portion 821, or may adjust a frequency of the output signal of the oscillation circuit portion 821 by a PLL circuit or a direct digital synthesizer circuit.

As described above, the circuit element 8 including the oscillation circuit 82 is provided at the upper surface together with the vibrator element 9, and is further electrically coupled to the vibrator element 9 via the wirings 71 and 72 provided at the upper surface 51 of the semiconductor substrate 5. Therefore, as compared with the case in the related art where the circuit element 8 and the vibrator element 9 are electrically coupled via the through electrodes, a thickness and a length of the wirings 71 and 72 can be sufficiently reduced, and the parasitic capacitance derived from the wirings 71 and 72 can be sufficiently reduced. Therefore, a crystal impedance (CI) value of the oscillation circuit 82 can be sufficiently reduced, and a high oscillation margin can be attained. Therefore, deterioration of the oscillation characteristics of the vibrator device 1 can be effectively prevented.

In particular, the circuit element 8 and the vibrator element 9 are arranged side by side at the upper surface 51 of the semiconductor substrate 5. In the present embodiment, the circuit element 8 and the vibrator element 9 are arranged side by side along the X axis. Further, in the plan view, the circuit element 8 is provided without overlapping the vibrator element 9. By providing the circuit element 8 in this way, it is possible to reduce the height (thickness) of the vibrator device 1. However, the present disclosure is not limited thereto. For example, a part of the circuit element 8 may overlap the vibrator element 9.

The vibrator element 9 is fixed to the semiconductor substrate 5 via the bonding members B1 and B2 at an end portion at the circuit element 8 side, that is, an end portion at the positive side of the X axis, and is electrically coupled to the wirings 71 and 72. That is, with respect to the vibrator element 9, the circuit element 8 is provided at a fixed end side of the vibrator element 9, that is, at the end side where the vibrator element 9 is fixed to the semiconductor substrate 5 via the bonding members B1 and B2. Accordingly, as compared with other arrangements, for example, when the circuit element 8 is provided at a free end side of the vibrator element 9, the wiring length of the wirings 71 and 72 electrically coupling the circuit element 8 and the vibrator element 9 can be shortened. Therefore, the parasitic capacitance derived from the wirings 71 and 72 can be reduced to be smaller. Therefore, the CI value of the oscillation circuit 82 can be reduced to be smaller, and a higher oscillation margin can be attained. Therefore, the deterioration of the oscillation characteristics of the vibrator device 1 can be more effectively prevented. However, the present disclosure is not limited thereto. For example, the vibrator element 9 may be fixed to the semiconductor substrate 5 via the bonding members B1 and B2 at an opposite-side end portion from the circuit element 8, that is, an end portion at the negative side in the X axis direction, and may be electrically coupled to the wirings 71 and 72.

Circuit 6

Returning to the description of the semiconductor circuit substrate 4, as shown in FIG. 3, the circuit 6 includes a processing circuit 66 that processes the output signal of the oscillation circuit 82. The processing circuit 66 includes a fractional phase locked loop (N-PLL) circuit 67, which is a phase synchronization circuit, and an output circuit 68.

The fractional N-PLL circuit 67, which is a fractional division PLL circuit, is a PLL circuit in which a division ratio of a fraction can be set by switching a division ratio of an integer to obtain a division ratio of a fraction (decimal) on average. Accordingly, it is possible to generate and output a signal of any frequency based on the output signal of the oscillation circuit 82. Then, the signal output from the fractional N-PLL circuit 67 is output from the predetermined terminal 651 via the output circuit 68.

In particular, according to the fractional N-PLL circuit 67, the following effects can be attained. Ina general oscillator, after the vibrator element is accommodated in the package, a part of the electrodes of the vibrator element is removed by laser irradiation to adjust the frequency of the vibrator element. However, in the vibrator device 1, the lid 3 is made of silicon. After the vibrator element 9 is accommodated in the package 2, it may be difficult to irradiate the vibrator element 9 with laser, and it may be difficult to adjust the frequency of the vibrator element 9. Even in such a case, if the fractional N-PLL circuit 67 is provided, it is possible to output a signal of any frequency from the circuit.

The fractional N-PLL circuit 67 includes a phase comparator 671 to which a reference frequency signal output from the oscillation circuit 82 is input, a charge pump circuit 675, a low-pass filter 672, a voltage controlled oscillator 673 to which a DC signal from the low-pass filter 672 is input, and a divider 674 to which a frequency signal output from the voltage controlled oscillator 673 is input. The frequency signal divided by the divider 674 is input to the phase comparator 671. The phase comparator 671 detects a phase difference between the reference frequency signal and the divided frequency signal, and outputs a detection result as a pulse voltage to the charge pump circuit 675. The charge pump circuit 675 converts the pulse voltage output from the phase comparator 671 into a current, and outputs the current to the low-pass filter 672. The low-pass filter 672 removes a high-frequency component from the output signal from the charge pump circuit 675, converts the output signal into a voltage, and outputs the output signal as a DC signal for controlling the voltage controlled oscillator 673. The divider 674 can implement fractional division by switching a division ratio of an integer to obtain a division ratio of a fraction on a time average. For example, an LC oscillation circuit including an inductor and a capacitor can be used as the voltage controlled oscillator 673.

Lid 3

Similar to the semiconductor substrate 5, the lid 3 is a silicon substrate. Accordingly, a linear expansion coefficient between the semiconductor substrate 5 and the lid 3 becomes equal, generation of thermal stress due to thermal expansion is prevented, and the vibrator device 1 has excellent vibrator characteristics. Since the vibrator device 1 can be formed by a semiconductor process, the vibrator device 1 can be manufactured with high accuracy and the size thereof can be reduced. However, the lid 3 is not particularly limited, and may be a semiconductor substrate other than silicon, for example, a substrate made of germanium, gallium arsenide, gallium arsenide phosphorus, gallium nitride, and silicon carbide.

As shown in FIG. 1, the lid 3 has a bottomed recess 31 that opens on the lower surface 30 and accommodates the vibrator element 9 therein. Further, the lid 3 is bonded to the upper surface 51 of the semiconductor substrate 5 via the bonding layer 75 at the lower surface 30 of the lid 3. Accordingly, the accommodation space S accommodating the vibrator element 9 is formed between the lid 3 and the semiconductor substrate 5. The accommodation space S is airtight and is in a depressurized state, preferably a state closer to vacuum. Accordingly, the oscillation characteristics of the vibrator element 9 are improved. However, an atmosphere of the accommodation space S is not particularly limited, and may be, for example, an atmosphere in which an inert gas such as nitrogen or Ar is sealed, and may be in an atmospheric pressure state or a pressurized state instead of depressurized state.

The vibrator device 1 is described above. As described above, such a vibrator device 1 includes: the semiconductor substrate 5 having the upper surface 51 as the first surface and the opposite-side lower surface 52 of the semiconductor substrate 5 from the upper surface 51 as the second surface; the vibrator element 9 provided at the upper surface 51; the circuit element 8 that is provided at the upper surface 51 and that includes the oscillation circuit 82; the wirings 71 and 72 that are provided at the upper surface 51 and that electrically couple the vibrator element 9 and the oscillation circuit 82; the processing circuit 66 that is provided at the lower surface 52 and that processes the output signal of the oscillation circuit 82; and through electrodes 530 that penetrate the semiconductor substrate 5 and that electrically couple the oscillation circuit 82 and processing circuit 66. In this way, the vibrator element 9 and the circuit element 8 are provided at the upper surface 51, and the vibrator element 9 and the circuit element 8 are electrically coupled via the wirings 71 and 72 provided at the upper surface 51. Accordingly, as compared with the case in the related art where the circuit element 8 and the vibrator element 9 are electrically coupled via the through electrodes, the thickness and the length of the wirings 71 and 72 can be sufficiently reduced, and the parasitic capacitance derived from the wirings 71 and 72 can be sufficiently reduced. Therefore, the crystal impedance (CI) value of the oscillation circuit 82 can be sufficiently reduced, and the high oscillation margin can be attained. Therefore, the deterioration of the oscillation characteristics of the vibrator device 1 can be effectively prevented.

As described above, the processing circuit 66 includes the phase locked loop (PLL) circuit. Accordingly, it is possible to generate and output a signal of any frequency based on the output signal of the oscillation circuit 82.

As described above, the circuit element 8 includes the temperature sensor 81 as the temperature detection element that detects the temperature of the vibrator element 9. By feeding back the temperature information output from the temperature sensor 81, the frequency fluctuation of the output signal can be prevented.

As described above, the vibrator element 9 and the circuit element 8 are arranged side by side at the upper surface 51. Accordingly, it is possible to reduce the height of the vibrator device 1.

As described above, the vibrator element 9 is electrically coupled to the wirings 71 and 72 at the end portion located at the circuit element 8 side, and in the present embodiment, at the positive side in the X axis direction. Accordingly, the wirings 71 and 72 can be made shorter. Therefore, the parasitic capacitance derived from the wirings 71 and 72 can be reduced to be smaller.

Second Embodiment

Figure 4:
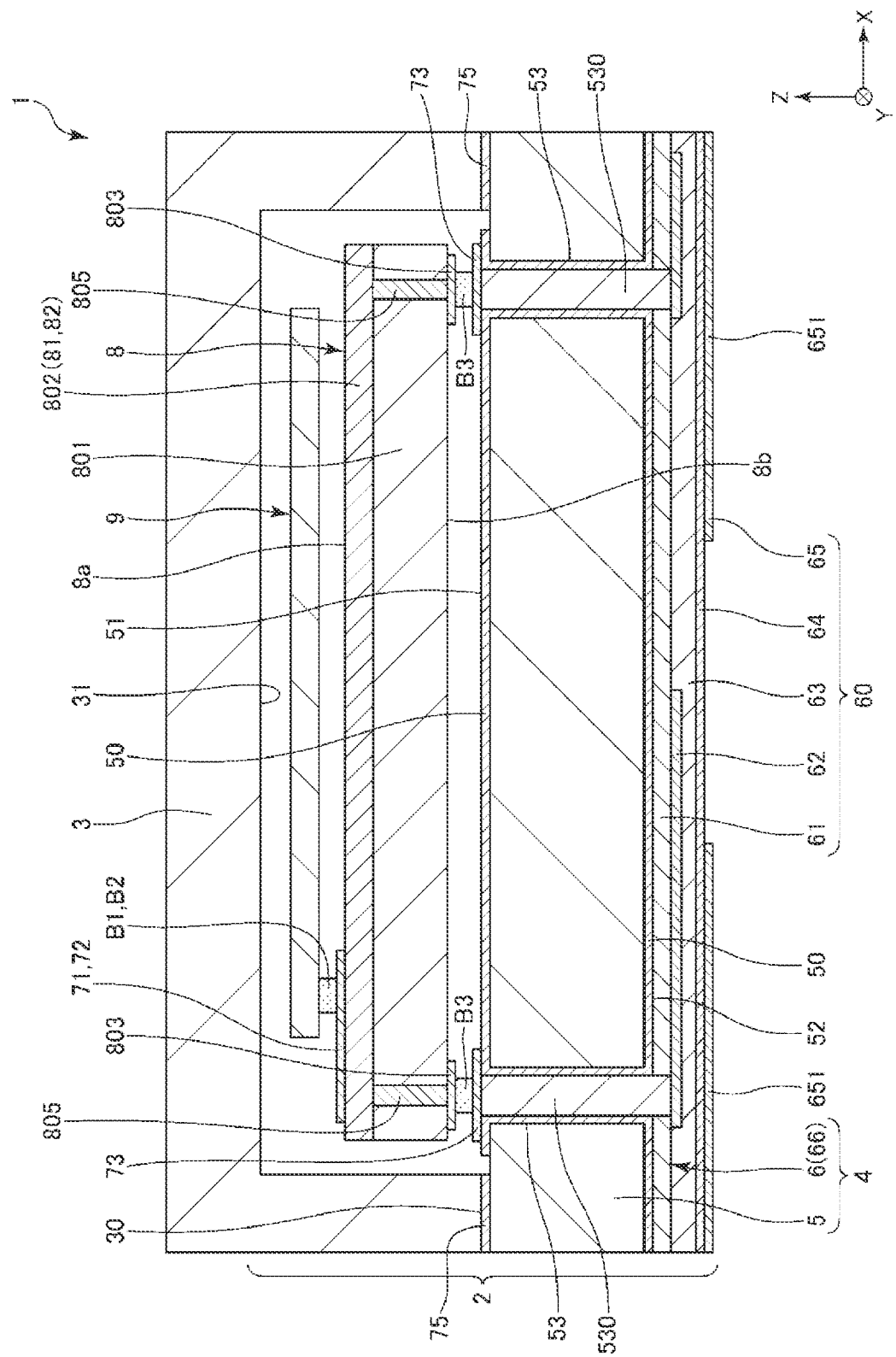
FIG. 4 is a cross-sectional view showing a vibrator device according to a second embodiment.
Figure 5:
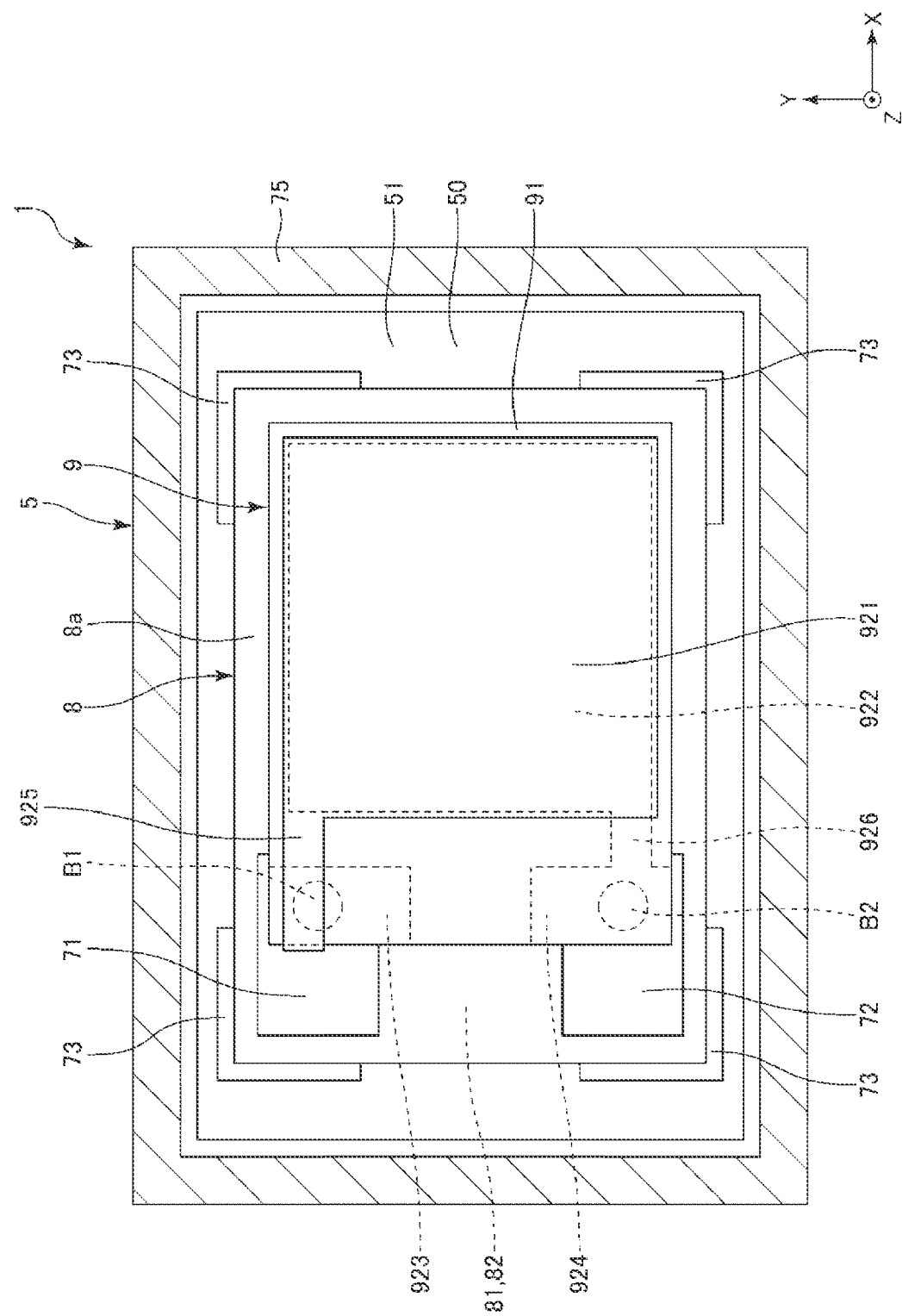
FIG. 5 is a plan view showing a vibrator element and a circuit element that are provided in the vibrator device shown in FIG. 4.

FIG. 4 is a cross-sectional view showing a vibrator device according to a second embodiment. FIG. 5 is a plan view showing a vibrator element and a circuit element of the vibrator device in FIG. 4.

The present embodiment is the same as the first embodiment described above, except that an arrangement of the vibrator element 9 and the circuit element 8 is different. In the following description, the present embodiment will be mainly described with respect to differences from the above-described embodiment, and the description of the same matters will be omitted. In FIGS. 4 and 5, the same components as those according to the above-described embodiment are denoted by the same reference numerals.

As shown in FIGS. 4 and 5, in the vibrator device 1 according to the present embodiment, the circuit element 8 is provided at the upper surface 51 that is a first surface of the semiconductor substrate 5 that is a first semiconductor substrate. The circuit element 8 includes the semiconductor substrate 801 that is a second semiconductor substrate, and the circuit portion 802 provided at an upper surface of the semiconductor substrate 801, that is, at an opposite-side surface of the semiconductor substrate 801 from the semiconductor substrate 5. As in the first embodiment described above, the circuit portion 802 is provided with the temperature sensor 81 and the oscillation circuit 82. Further, the vibrator element 9 is provided at an upper surface 8a which is a third surface of the circuit element 8. The pair of wirings 71 and 72 electrically coupling the oscillation circuit 82 and the vibrator element 9 are provided at the upper surface 8a of the circuit element 8. In this way, the circuit portion 802 is provided at the upper surface 8a side of the circuit element 8, the vibrator element 9 is provided at the upper surface 8a of the circuit element 8, and, furthermore, the wirings 71 and 72 electrically coupling the vibrator element 9 and the oscillation circuit 82 are provided at the upper surface 8a. Accordingly, a length of the wirings 71 and 72 can be reduced. Therefore, parasitic capacitance derived from the wirings 71 and 72 can be sufficiently reduced. Therefore, a crystal impedance (CI) value of the oscillation circuit 82 can be sufficiently reduced, and a high oscillation margin can be attained. Therefore, deterioration of the oscillation characteristics of the vibrator device 1 can be effectively prevented.

The plurality of terminals 803 are provided at a lower surface 8b of the circuit element 8, that is, a surface at the semiconductor substrate 5 side. The circuit element 8 has the plurality of through electrodes 805 as second through electrodes that penetrate the semiconductor substrate 801. The circuit portion 802 and the terminals 803 are electrically coupled via these through electrodes 805. Further, the circuit element 8 is fixed to the upper surface 51 of the semiconductor substrate 5 via the bonding member B3 at the lower surface 8b, and the terminals 803 and the through electrodes 530 which is first through electrodes are electrically coupled via the bonding member B3. Accordingly, electrical coupling between the oscillation circuit 82 and the processing circuit 66 becomes easy.

As described above, the vibrator device 1 according to the present embodiment includes: the semiconductor substrate 5 as the first semiconductor substrate having the upper surface 51 that is the first surface and the lower surface that is the opposite-side second surface of the semiconductor substrate 5 from the upper surface 51; the circuit element 8 including the semiconductor substrate 801 that is the second semiconductor substrate, that is provided at the upper surface 51, and that has the upper surface 8a that is the third opposite-side surface of the semiconductor substrate 801 from the upper surface 51, and the oscillation circuit 82 provided at the upper surface 8a; the vibrator element 9 provided at the upper surface 8a of the circuit element 8; the wirings 71 and 72 that are provided at the upper surface 8a and that electrically couple the vibrator element 9 and the oscillation circuit 82; the processing circuit 66 that is provided at the lower surface 52 and that processes the output signal of the oscillation circuit 82; and the through electrodes 530 that are the first through electrodes, that penetrate the semiconductor substrate 5, and that electrically couple the oscillation circuit 82 and the processing circuit 66.

In this way, the oscillation circuit 82 is provided at the upper surface 8a side of the circuit element 8, the vibrator element 9 is provided at the upper surface 8a of the circuit element 8, and furthermore, the wirings 71 and 72 electrically coupling the vibrator element 9 and the oscillation circuit 82 are provided at the upper surface 8a. Accordingly, as compared with the case in the related art where the circuit element 8 and the vibrator element 9 are electrically coupled via the through electrodes, the thickness and length of the wirings 71 and 72 can be sufficiently reduced, and the parasitic capacitance derived from the wirings 71 and can be sufficiently reduced. Therefore, the crystal impedance (CI) value of the oscillation circuit 82 can be sufficiently reduced, and the high oscillation margin can be attained. Therefore, the deterioration of the oscillation characteristics of the vibrator device 1 can be effectively prevented.

As described above, the circuit element 8 includes the through electrodes 805 as the second through electrodes that penetrate the semiconductor substrate 801 and that electrically couple the oscillation circuit 82 and the through electrodes 530. Accordingly, the electrical coupling between the oscillation circuit 82 and the processing circuit 66 becomes easy.

According to the second embodiment as described above, the same effects as those according to the first embodiment can be attained.

Although the vibrator device according to the present disclosure is described based on the illustrated embodiments, the present disclosure is not limited thereto. The configuration of each part may be replaced with any configuration having the same function. Any other components may be added to the present disclosure. The embodiments may be combined as appropriate.

In the embodiments described above, the vibrator device 1 is applied to the oscillator, whereas the present disclosure is not limited thereto. For example, using the vibrator element 9 as a physical quantity sensor element that can detect angular velocity and acceleration, the vibrator device 1 can be applied to various physical quantity sensors such as an angular velocity sensor and an acceleration sensor.

In the embodiments described above, the lid 3 has the recess 31, whereas the present disclosure is not limited thereto. For example, the semiconductor substrate 5 of the semiconductor circuit substrate 4 may have a bottomed recess that opens at the upper surface 51 of the semiconductor substrate 5. The lid 3 may have a flat plate shape. In this case, the vibrator element 9 may be fixed to a bottom surface of the recess of the semiconductor substrate 5.

What is claimed is:

1. A vibrator device comprising:
a semiconductor substrate having a first surface and an opposite-side second surface of the semiconductor substrate from the first surface;
a vibrator element provided at the first surface;
a circuit element that is provided at the first surface and that includes an oscillation circuit;
a wiring that is provided at the first surface and that electrically couples the vibrator element and the oscillation circuit;
a processing circuit that is provided at the second surface and that processes an output signal of the oscillation circuit;
a stacked body that is provided at the second surface and that includes an insulating layer, a wiring layer, and a terminal layer; and
a through electrode that penetrates the semiconductor substrate from the first surface to the second surface, and the through electrode electrically couples the oscillation circuit provided at the first surface of the semiconductor substrate and the processing circuit provided at the second surface of the semiconductor substrate,
wherein the processing circuit includes a plurality of active elements electrically coupled to one another via wirings of the wiring layer of the stacked body and the processing circuit is integrally formed with the semiconductor substrate.

2. The vibrator device according to claim 1, wherein the processing circuit includes a phase locked loop (PLL) circuit.

3. The vibrator device according to claim 1, wherein the circuit element includes a temperature detection element that detects a temperature of the vibrator element.

4. The vibrator device according to claim 1, wherein the vibrator element and the circuit element are arranged side by side at the first surface.

5. The vibrator device according to claim 4, wherein the vibrator element is electrically coupled to the wiring at an end portion located at a circuit element side.

6. A vibrator device comprising:
a first semiconductor substrate having a first surface and an opposite-side second surface of the first semiconductor substrate from the first surface;
a circuit element including a second semiconductor substrate that is provided at the first surface and that has an opposite-side third surface of the second semiconductor substrate from the first surface, and an oscillation circuit provided at the third surface;
a vibrator element provided at the third surface of the circuit element;
a wiring that is provided at the third surface and that electrically couples the vibrator element and the oscillation circuit;
a processing circuit that is provided at the second surface and that processes an output signal of the oscillation circuit; and
a first through electrode that penetrates the first semiconductor substrate and that electrically couples the oscillation circuit and the processing circuit.

7. The vibrator device according to claim 6, wherein the circuit element includes a second through electrode that penetrates the second semiconductor substrate and that electrically couples the oscillation circuit and the first through electrode.

8. The vibrator device according to claim 1, further comprising:
a lid that is bonded to the first surface of the semiconductor substrate and that forms an accommodation space that accommodates the vibrator element between the lid and the semiconductor substrate.

* * * * *